US012652001B2

(12) United States Patent
Koroglu et al.

(10) Patent No.: US 12,652,001 B2
(45) Date of Patent: Jun. 9, 2026

(54) WAKE-UP RADIO HAVING STACKED CIRCUIT CONFIGURATION WITH ULTRA-LOW POWER CONSUMPTION

(71) Applicant: Silicon Laboratories Inc., Austin, TX (US)

(72) Inventors: Mustafa Koroglu, Austin, TX (US); John Khoury, Austin, TX (US); Yan Zhou, Spicewood, TX (US); Ajmal Vadakkan Kayyil, Corvallis, OR (US); Vitor Pereira, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 398 days.

(21) Appl. No.: 18/337,278

(22) Filed: Jun. 19, 2023

(65) Prior Publication Data

US 2024/0421770 A1     Dec. 19, 2024

(51) Int. Cl.
| | |
|---|---|
| *H04L 12/00* | (2006.01) |
| *H03B 5/12* | (2006.01) |
| *H03F 1/02* | (2006.01) |
| *H03F 3/45* | (2006.01) |
| *H04W 52/02* | (2009.01) |

(52) U.S. Cl.
CPC ......... *H03F 1/0205* (2013.01); *H03B 5/1212* (2013.01); *H03F 3/45475* (2013.01); *H04W 52/0235* (2013.01); *H03F 2200/294* (2013.01); *H03F 2200/451* (2013.01)

(58) Field of Classification Search
CPC ......... H03F 3/3022; H04Q 1/30; H04L 7/033; H04B 1/0064; H01L 23/66; H03D 7/163

USPC .......................................................... 370/311
See application file for complete search history.

(56) References Cited

U.S. PATENT DOCUMENTS

| | | | | |
|---|---|---|---|---|
| 5,311,149 A | * | 5/1994 | Wagner | H03D 7/163 |
| | | | | 455/314 |
| 11,778,555 B2 | * | 10/2023 | Kim | H04W 52/0225 |
| | | | | 370/311 |
| 2008/0079652 A1 | * | 4/2008 | Mohamadi | H01L 23/66 |
| | | | | 343/893 |
| 2008/0132192 A1 | * | 6/2008 | Lim | H04B 1/0064 |
| | | | | 455/315 |
| 2012/0299651 A1 | * | 11/2012 | Goel | H03L 7/099 |
| | | | | 330/185 |

(Continued)

FOREIGN PATENT DOCUMENTS

WO     WO-2021146723 A1 *   7/2021   ............. H04L 7/033

OTHER PUBLICATIONS

Po-Han Peter Wang, A Dual-Mode Wi-Fi/BLE Wake-Up Receiver, IEEE Journal of Solid-State Circuits, vol. 56, No. 4, Apr. 2021, pp. 1288-1298.

(Continued)

*Primary Examiner* — Frantz Coby
(74) *Attorney, Agent, or Firm* — Trop, Pruner & Hu, P.C.

(57) ABSTRACT

In one embodiment, an apparatus includes: a wake-up radio to issue a trigger signal in response to detection of a wake-up message in a radio frequency (RF) signal; and a second radio coupled to the wake-up radio, the second radio to wake up in response to receipt of the trigger signal. The wake-up radio may be coupled to the second radio without substantial loading, and may be configured with stacked circuits to reuse currents.

20 Claims, 9 Drawing Sheets

100

Transmitter                                              Receiver

(56)  References Cited

U.S. PATENT DOCUMENTS

2022/0322235 A1 *  10/2022  Odelberg  ............. H03F 3/3022

OTHER PUBLICATIONS

Yi Shen Yeh et al., Wake-Up Radio Having Single Bit Correlators, U.S. Appl. No. 18/175,606, filed Feb. 28, 2023, 42 pgs.
Chinese Patent Office, Office Action mailed Aug. 5, 2024 in Chinese Patent Application No. 202410791527.4 (1 page).

* cited by examiner

IF Peak Detector and Comparator

FIG. 6

WAKE-UP RADIO HAVING STACKED CIRCUIT CONFIGURATION WITH ULTRA-LOW POWER CONSUMPTION

BACKGROUND

Radios are incorporated into ever smaller and evolving types of devices. Current trends expand use of radios for small, low cost, low power devices including a variety of Internet of Things (IoT) devices.

Proposals to reduce power consumption include providing a radio having lower power consumption that can be used for purposes of triggering a wake-up of a main radio. However, the complexity involved in this radio (which is used to detect if there is a request for communication, and if so, enable a main receiver) can still consume high power, causing short battery life.

Available low power Bluetooth Low Energy (BLE) receivers typically consume around 10 milliwatts (mW) of power. This level of power consumption is quite high for a wake-up receiver. Therefore, it is desirable for a wake-up receiver to have much less power consumption as compared to the main receiver.

Other solutions provide a low power radio frequency (RF) signal detector that couples to a low noise amplifier (LNA) input. This technique, however, is capable of detecting the presence of any RF signal in a wide band only, and is not able to detect a signal in a particular narrow channel.

SUMMARY OF INVENTION

In one aspect, an apparatus includes multiple stack circuits. A first stack circuit may include: a low noise amplifier (LNA) to receive and amplify a radio frequency (RF) signal; and a voltage controlled oscillator (VCO) coupled to the LNA, the VCO to generate at least one clock signal. The first stack circuit is coupled to a supply voltage node and is to reuse a first current for the LNA and the VCO. A second stack circuit may be coupled to the first stack circuit and may include: a local oscillator (LO) generation circuit to generate at least one LO clock signal based at least in part on the at least one clock signal; and at least one buffer coupled to the LO generation circuit to buffer the at least one LO clock signal and output a differential complex clock signal. The second stack circuit is coupled to the supply voltage node and is to reuse a second current for the LO generation circuit and the at least one buffer.

In one implementation, the apparatus further comprises a low dropout regulator coupled to the supply voltage node, the low dropout regulator to provide a regulated voltage to the supply voltage node. The VCO may be an open loop VCO. An automatic frequency control loop may couple to the VCO to adjust the VCO at a frequency substantially lower than the clock signal. The VCO is coupled to the supply voltage node and the LNA is coupled to a reference voltage node, the LNA coupled to the VCO at a midpoint of the first stack circuit.

In an implementation, the apparatus further comprises a polyphase filter coupled between the VCO and the LO generation circuit, the polyphase filter to receive the at least one clock signal and output a polyphase clock signal. The at least one buffer may include a first buffer to buffer the differential complex clock signal, and the LO generation circuit may be implemented with a duty cycled pulse generator to provide the at least one LO clock signal for mixing with the amplified RF signal.

In an implementation, the apparatus further includes a transimpedance amplifier (TIA) coupled to the second stack circuit, the TIA to receive and amplify an intermediate frequency (IF) signal, the IF signal based on the RF signal. The apparatus also may include: a peak detector coupled to the TIA, the peak detector to detect a peak signal of the amplified IF signal; and a comparator to compare the peak signal to a threshold signal. The peak detector is to self-generate the threshold signal based on the peak signal. The LNA of the first stack circuit may be configured to provide a low impedance at DC to achieve a stable midpoint voltage for the first stack circuit.

In another aspect, an apparatus includes: a peak detector to receive quadrature IF signals and output, at an output node, a maximum signal of the quadrature IF signals, the peak detector comprising a switched capacitor circuit to store the maximum signal and generate a threshold signal; and a comparator coupled to the peak detector, the comparator to compare the maximum signal to the threshold signal.

In an embodiment, the peak detector is to self-generate the threshold signal. The threshold signal may be an average value of the maximum signal. The switched capacitor circuit may include: a hold circuit to hold the maximum signal with droop, the hold circuit comprising at least one first capacitor and at least one first switch, the at least one first switch controlled by a first phase signal. The switched capacitor circuit may further include: a low pass filter coupled to the hold circuit, where the low pass filter is to provide the threshold signal to the comparator circuit.

In an embodiment, the apparatus further includes: a second switch controlled by the first phase signal, the second switch to couple the threshold signal to the comparator circuit; and a third switch controlled by a second phase signal to couple the maximum signal to the comparator circuit.

In yet another aspect, an apparatus includes: a wake-up radio to issue a trigger signal in response to detection of a wake-up message in a RF signal, and a second radio coupled to the wake-up radio, the second radio to wake up in response to receipt of the trigger signal. The wake-up radio may be coupled to the second radio without substantial loading.

In an example, the wake-up radio includes: a low dropout regulator to provide a supply voltage to a supply voltage node; a first stack circuit coupled to the supply voltage node, and a second stack circuit coupled to the supply voltage node. The first stack circuit may include: an amplifier to receive and amplify the RF signal; and an oscillator coupled to the amplifier, the oscillator to generate at least one clock signal, where the first stack circuit is to reuse a first current for the amplifier and the oscillator. The second stack circuit may include: a clock generation circuit to receive the at least one clock signal and output a polyphase clock signal; and at least one buffer coupled to the clock generation circuit to buffer the polyphase clock signal and output a set of clock signals, where the second stack circuit is to reuse a second current for the clock generation circuit and the at least one buffer.

The apparatus may further include a TIA coupled to the supply voltage node, the first stack circuit, and the second stack circuit, the TIA to receive and amplify IF signals, the IF signals based on the RF signal. The apparatus also may include: a peak detector to receive the IF signals and output a maximum signal of the IF signals, the peak detector comprising a switched capacitor circuit to store the maximum signal and a threshold signal; and a comparator coupled to the peak detector, the comparator to compare the maximum signal to the threshold signal and output a trigger signal when the maximum signal exceeds the threshold signal.

In an example, the amplifier may include: a plurality of gain slices; and a plurality of dummy load circuits coupled to the plurality of gain slices.

The apparatus further may include a controller to: control a number of the plurality of slices to be enabled based at least in part on a gain control signal; and cause at least one of the plurality of dummy loads to be coupled to a midpoint of the first stack circuit when a corresponding slice of the plurality of slices is disabled.

BRIEF DESCRIPTION OF THE DRAWINGS

FIG. 6 is a schematic diagram of a peak detector and comparator in accordance with an embodiment.

DETAILED DESCRIPTION

In various embodiments, a device is provided with multiple radios, including a main radio and a wake-up radio (WuR), which is a low power radio defined to enable devices to save power by using it to wake-up the rest of the device when required. Embodiments described herein are used in conjunction with a Bluetooth Low Energy (BLE) radio, to prevent its use when there is no activity directed at the device.

In various embodiments, a wake-up radio may be implemented with a configuration that enables ultra-low power operation (less than 200 microWatts). Although low power, this wake-up receiver meets or exceeds BLE standard requirements in terms of sensitivity and blocker performance. In order to meet this tight power consumption budget, a current reuse architecture is used to stack circuits having similar current consumptions between supply voltage and ground levels.

In one or more embodiments, a radio frequency (RF) oscillator and a low noise amplifier (LNA), which are the highest current consuming blocks, are stacked together in a first stack circuit. In turn, a second stack circuit may include a clock generation circuitry to generate 25% duty cycle local oscillator (LO) signals and one or more LO buffers. In this configuration a significant portion of a power consumption budget (e.g., exceeding 75%) is consumed in the RF circuits of the first stack circuit. By stacking these circuits, bias currents may be reused, enabling the radio to meet a tight current consumption budget, which in an implementation is only 110 microamperes with a 1.8 volt (V) power supply.

This wake-up radio may be implemented as a zero-intermediate frequency (IF) receiver that provides channel selectivity while detecting an RF signal. In one or more embodiments, the receiver has a very low input capacitive load (e.g., approximately 30 femtoFarads (fF)) and therefore can be directly coupled to an LNA input of the main receiver with minimal impact to the main receiver.

As such, this WuR may be designed and controlled as described herein to realize significant improvements in power consumption relative to the main receiver (e.g., a 50× improvement in power consumption (<200 μW)) with fast wake-up time (<20 ms), while maintaining a sensitivity of −89.5 dBm at a bit error rate (BER) of 0.1%, in an example. While the wake-up receiver may consume 200 μW, by duty cycling the ON time, as low as 2 μW of power consumption can be achieved at the expense of increased latency. As will be described herein, these power savings may be realized by the design and configuration of the receiver and its control to tightly schedule activity of different portions of the receiver in a power-conscious manner.

Figure 1:
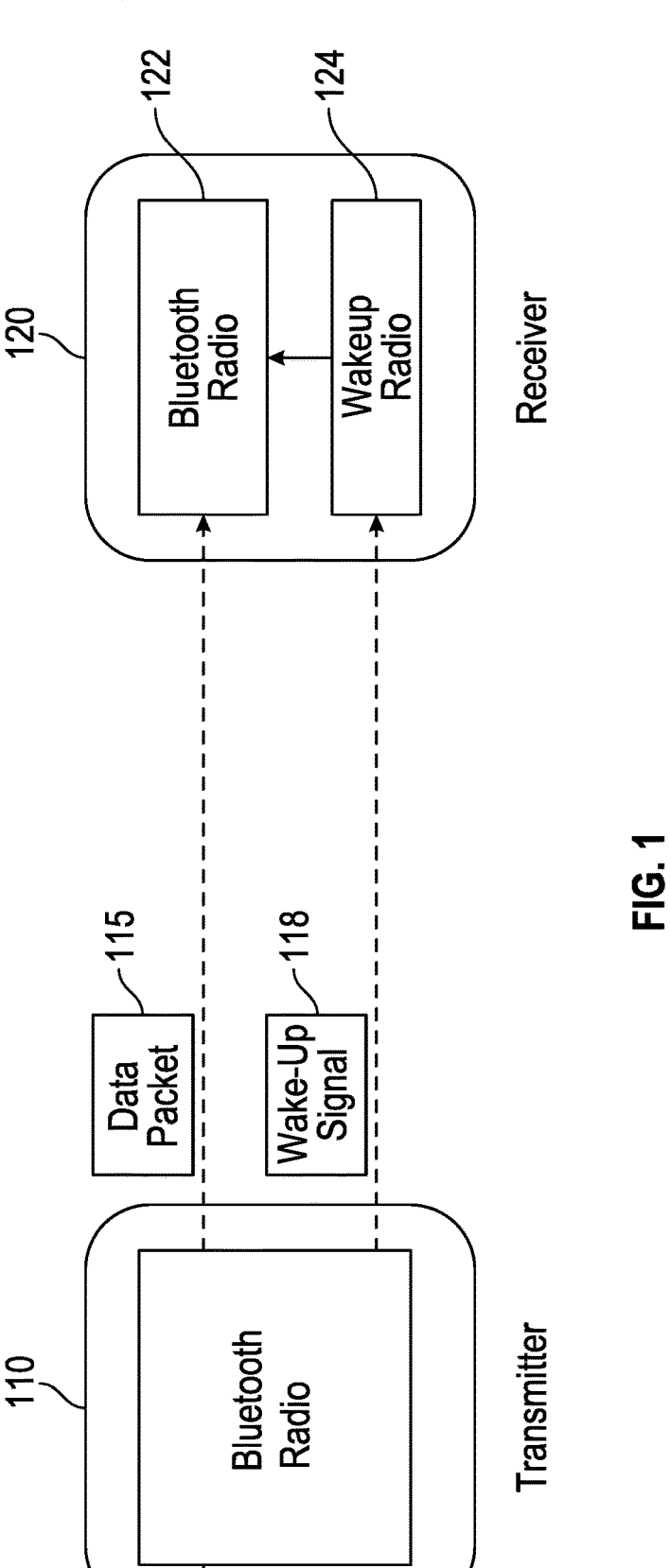
FIG. 1 is a block diagram of a wireless communication environment in accordance with an embodiment.

Referring now to FIG. 1, shown is a block diagram of a wireless communication environment in accordance with an embodiment. As shown in FIG. 1, a wireless communication environment 100 such as a wireless local area network (WLAN) includes various devices such as Internet of Things (IoT) devices, including a transmitter 110 and a receiver 120. Although embodiments are not limited in this regard, assume for purposes of discussion that these components communicate via at least one wireless communication protocol such as one or more Bluetooth protocols. The components also may be configured to communicate according to other wireless communication protocols, including Wi-Fi, cellular communications, e.g., 5G or beyond, and so forth. Although only two devices are shown for ease of discussion, additional devices may be present in other embodiments.

With embodiments, significant power consumption savings may be realized by causing main radio circuitry of at least receiver 120 to remain in a low power mode (typically it would be completely powered down), unless a given communication is to occur between the devices. To this end, at least receiver 120 may include a wake-up radio (WuR). More specifically as shown, receiver 120 includes, in addition to a Bluetooth radio 122 (which may be the main or primary Bluetooth receiver), a WuR 124. In some embodiments, transmitter 110 may also include, in addition to a Bluetooth radio 112 (which may be the main or primary Bluetooth transmitter), a WuR (not shown in FIG. 1).

With this arrangement, the main radio components of the devices may be maintained in a low power mode until a communication is to occur. A transmitter starts a wake-up event to communicate with a receiver when operating in a wake-up mode. To initiate a wake-up of Bluetooth radio 122, Bluetooth radio 112 communicates a wake-up signal 118, to be received by wake-up radio 124. Upon successful receipt and processing of wake-up signal 118, which in an embodiment may be include a wake-up protocol data unit (PDU), wake-up radio 124 communicates a wake-up signal, an interrupt or other notification signal. This signal causes Bluetooth radio 122 to wake up, thereby enabling it to receive a data packet 115 communicated from Bluetooth radio 112.

During a wake-up event, the wake-up transmitter sends a wake-up message to a specific wake-up receiver or group of receivers using an address of one or more targets. Upon successful wake-up requests in which a response is expected, the wake-up receiver responds, e.g., with an advertising event. In an embodiment, the wake-up receiver does not respond to invalid requests. In one implementation, a wake-up event is considered as closed if the wake-up receiver has responded or a given amount of time has elapsed. The wake-up transmitter may repeat the wake-up event for one or more attempts if the receiver has not responded. If repeated attempts are not successful, the wake-up procedure can be considered as failed and the controller notifies the host. The wake-up receiver may be controlled to enter a WuR scanning state to listen for a packet sent on a wake-up channel, e.g., for a given scan window duration, after which the wake-up receiver may enter into an idle state until a next wake-up scan window.

Although shown at this high level for ease of discussion, understand that various enhancements are possible in embodiments. For example, understand that while discussed above as a "transmitter" and a "receiver," each device may be a full radio having transmit and receive capabilities.

Figures 2A, 2B, 2C:
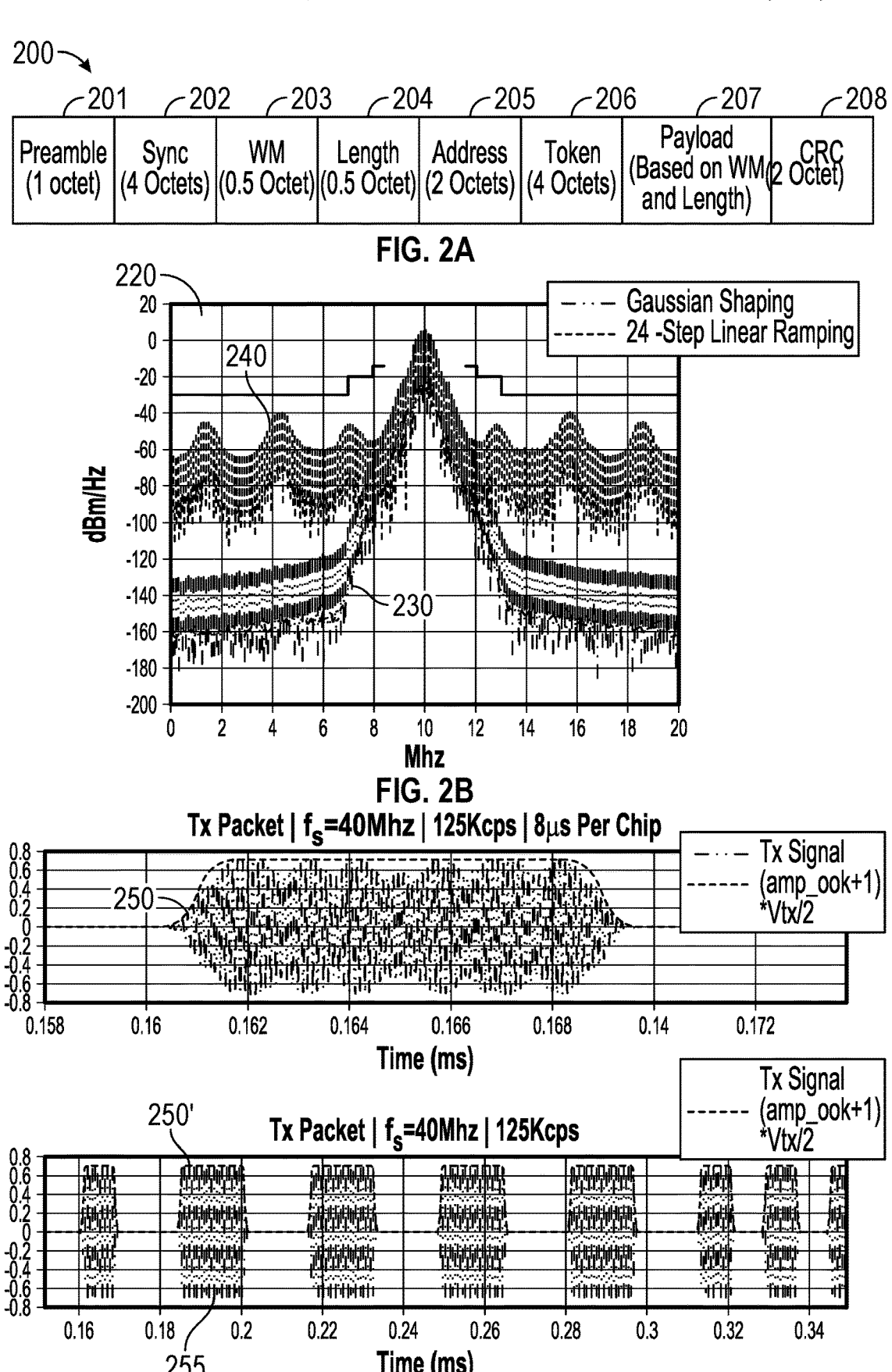
FIG. 2A is a block diagram illustrating an arrangement of a wake-up packet in accordance with an embodiment.
FIG. 2B is a transmission power spectrum of a wake-up communication in accordance with an embodiment.
FIG. 2C is a time domain plot of a MOOK-modulated wake-up packet in accordance with an embodiment.

Depending on implementation, a wake-up packet may be a fixed length or variable length packet. With reference now to FIG. 2A, shown is a block diagram illustrating an arrangement of a wake-up packet in accordance with an embodiment. As shown in FIG. 2A, wake-up packet 200 may be modulated with Manchester encoding (ME) on-off keying (MOOK). With embodiments, wake-up packet 200 may be communicated at a data rate of 125 kilobits per second (Kbps). The MOOK information may be modulated by a Bluetooth low energy 1M Gaussian frequency shift keying (GFSK) physical unit (PHY) circuit using random data, e.g., PRBS9 data. By adding the MOOK modulation to such data, a bit rate of 62.5 Kbps may be realized, with 2-chip Manchester coding.

In a particular embodiment, WuR data is sent with OOK modulation, in which a chip sent with a value of "0" means no carrier while a chip sent with a value of "1" means there is carrier. GFSK is used to modulate the carrier to distribute the RF power over a wide frequency band to shape the signal spectrum. The mapping of input bit to output chip sequence (in transmission order) is Manchester encoded as shown in Table 1.

TABLE 1

| Input Bit | Output Chip Sequence |
|-----------|---------------------|
| 0 | 01 |
| 1 | 10 |

Although embodiments are not limited in this regard, in implementations wake-up packets may be sent on one or more particular wireless channels. For example, a channel that is used for wake-up requests may have low interference, to minimize re-transmission of wake-up requests. In one embodiment, non-primary advertising BLE channels that do not overlap with frequently used Wi-Fi channels (e.g., channels 1, 6 and 11) may be used and/or channels that are a multiple of 16 MHz.

With reference to FIG. 2A, a packet length of wake-up packet 200 may be between 104 and 144 bits, corresponding to a time duration of between 1.664-2.304 milliseconds (ms). As shown in FIG. 2A, wake-up packet 200 is formed of multiple fields, namely a preamble field 201 which may be 1 octet (8 bits), a sync word field 202 which may be 4 octets, a wake-up mode field 203 which may be 4 bits, a length field 204 which may be 4 bits (to indicate a length of a payload), an address field 205 which may be 2 octets, a token field 206 which may be 4 octets, a payload field 207 which may have a length based on a given wake-up mode and length, and finally, a cyclic redundancy check (CRC) field 208 which is 2 octets.

In embodiments a WuR uses preamble and sync word fields to detect a wake-up message and acquire timing synchronization. In an embodiment, address field 205 may be 15 bits and be split into Receiver ID and a Group ID. In a particular embodiment, the Group ID is a 7-bit value and the Receiver ID is an 8-bit value.

In an embodiment, wake-up mode field 203 is 4 bits and can be defined as shown in Table 2 below.

TABLE 2

| Value | Details |
|-------|---------|
| 0000 | Wake up device or devices which are targeted using the Target Address. This mode has no payload and length is 0. This mode requires a Response. |
| 0001 | The targeted device accepts timing sync to reset a local real time clock (RTC). This mode has no payload and length is 0. This mode does not initiate a Response. |
| 0010 | The targeted device accepts the timing sync to reset the local RTC and also wakes up the device. This mode has no payload and length is 0. This mode requires a Response. |
| 0011 to 1111 | Reserved for future use |

Token field 206 may be used to identify the wake-up transmitter. A WuR may support multiple stored tokens (e.g., a single token for each supported transmitter). Although embodiments are not limited in this regard, example payloads may be used to provide commands, such as commands to toggle LED states and switch images on a device (e.g., a previously transmitted image). In turn, CRC field 208 may be a CRC value that is computed over the WM, Length, Address, Token, and Payload fields. Of course while shown with this particular arrangement of a wake-up packet, variations are possible in other implementations.

Referring now to FIG. 2B, shown is a transmission power spectrum of a wake-up communication in accordance with an embodiment. As shown in FIG. 2B, power spectrum 220 includes a Bluetooth low energy (BLE) transmission 230 that is sent using GFSK modulation, namely a BLE-modulated signal containing random data. On top of this a MOOK-modulated transmission 240 is sent that may form at least part of a wake-up packet in accordance with an embodiment. (Need to confirm that 240 is MOOK signal modulating the GFSK signal, 230).

Referring now to FIG. 2C, shown is a time domain plot of an MOOK-modulated wake-up packet in accordance with an embodiment. As shown in FIG. 2C, wake-up packet 250' is illustrated, and an inset 250 zooms in on a portion of wake-up packet 250'. As illustrated, the amplitude of an underlying BLE packet is MOOK-modulated and a dense portion 255 (as shown zoomed in at 250') includes the original BLE-modulated data (here, a portion of a packet zoomed in showing a . . . 010 . . . chip sequence).

Figures 3A, 3B:
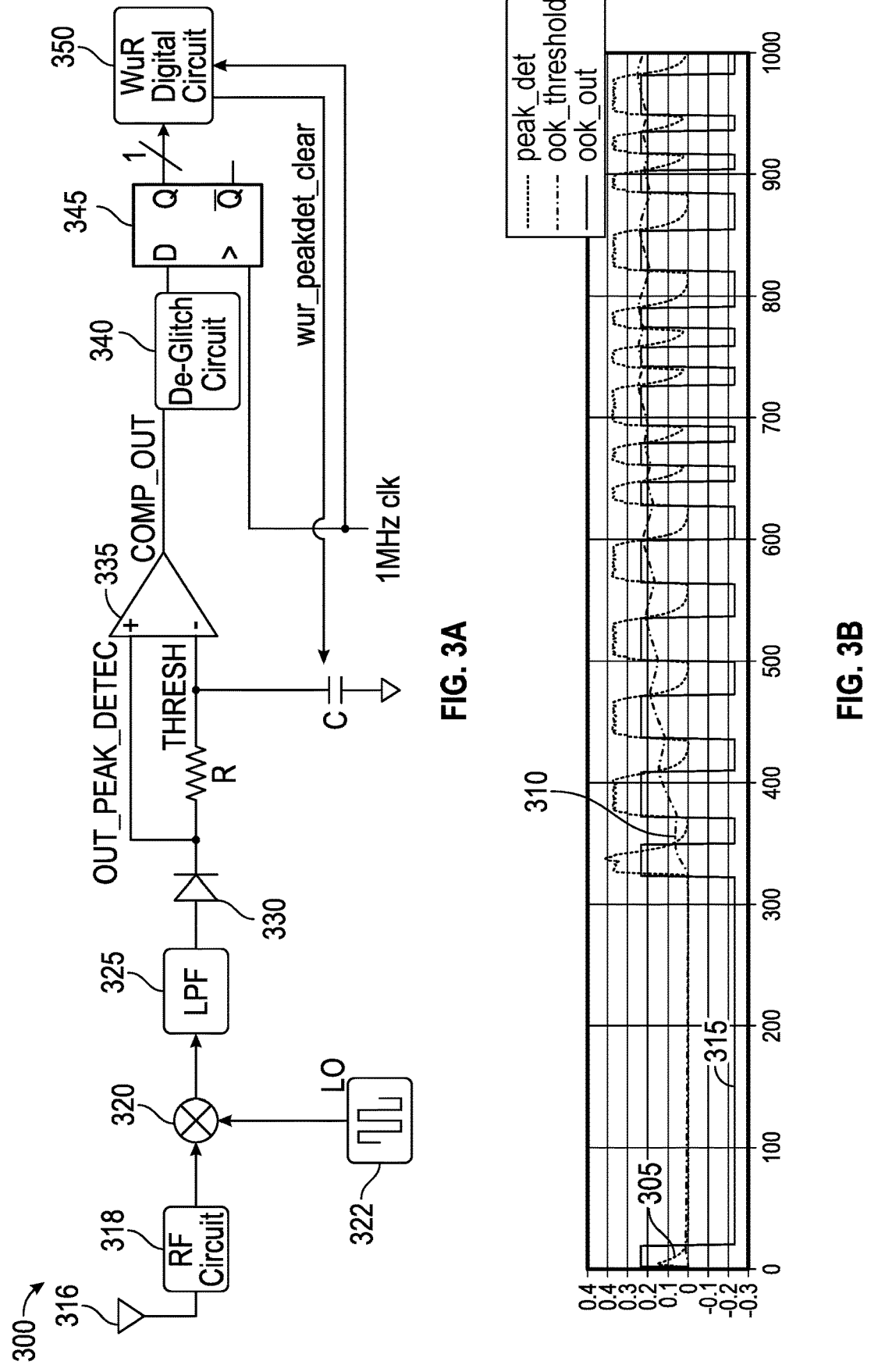
FIG. 3A is a block diagram of a portion of a wake-up receiver in accordance with an embodiment.
FIG. 3B is a timing diagram illustrating various signals relevant to the wake-up radio of FIG. 3A.

Referring now to FIG. 3A, shown is a block diagram of a portion of a wake-up receiver in accordance with an embodiment. As shown in FIG. 3A, a receiver 300 may be implemented as part of a multi-mode receiver such as receiver 120 of FIG. 1. As shown, incoming RF signals are received via an antenna 316 and are provided to a RF circuit 318. In various embodiments, RF circuit 318 may be configured to perform various processing on the received RF signal such as amplification in a LNA, filtering in one or more filters and so forth.

The resulting RF signals are provided to a mixer 320, which downconverts the RF signals to lower frequencies signals, e.g., zero intermediate frequency (ZIF). To this end, mixer 320 downconverts the received RF signals using a mixing signal received from a local oscillator 322. Resulting downconverted signals are passed through a low pass filter (LPF) 325 and are provided to a peak detector 330 (illustrated as a diode) that outputs a peak signal (OUT_PEAK_DETECT). As shown, the peak signal is provided to a positive input of a comparator 335. In turn, the peak signal is further filtered in an RC filter formed of a resistor R and a capacitor C that results in a threshold signal that is provided to a negative input of comparator 335.

The resulting comparison signal (COMP_OUT) is provided to a de-glitch circuit 340 that provides a deglitched output to a D-type flip-flop 345 that is clocked with a 1 Megahertz (MHZ) clock signal. In turn, the output of flip-flop 345 is provided as a 1-bit digital signal that is output to a digital portion of the wake-up radio (WuR digital circuit 350).

As will be further described below, digital circuit 350 is configured to process this incoming bit stream to detect the presence of a valid wake-up packet. Upon such detection, digital circuit 350 outputs an interrupt signal or other notification, which may be sent to an energy management unit and/or a main radio circuit. As further shown, digital circuit 350 may generate a clear signal (wur_peakdata_clear) to cause the threshold signal to be cleared, by discharging capacitor C. This is so, as the threshold may undesirably increase, e.g., in the presence of a high-power blocker (such as a Wi-Fi blocker signal). Thus this signal causes a reset of the threshold signal in the case of an undesired increase in the threshold due to such blocker. Understand while shown at this high level in the embodiment of FIG. 3A, many variations and alternatives are possible.

Referring now to FIG. 3B, shown is a timing diagram illustrating various signals relevant to the wake-up radio of FIG. 3A. In an embodiment, an incoming RF signal has MOOK modulation. With this Manchester-based encoding, amplitude information is recovered via a peak detector. A resulting peak signal 305 is compared to a threshold 310. As shown, threshold 310, which is based on peak signal 305, varies (according to the RC filter characteristics). The resulting comparison output is thus a single bit sample at the clock rate of the clock that drives a flip-flop (such as flip-flop 345). A clock signal of 1 MHz results in an oversampling of 8. This 1-bit signal stream 315 is thus the input to digital circuit 350. Digital circuit 350 may perform a timing acquisition based on this signal.

Figure 4:
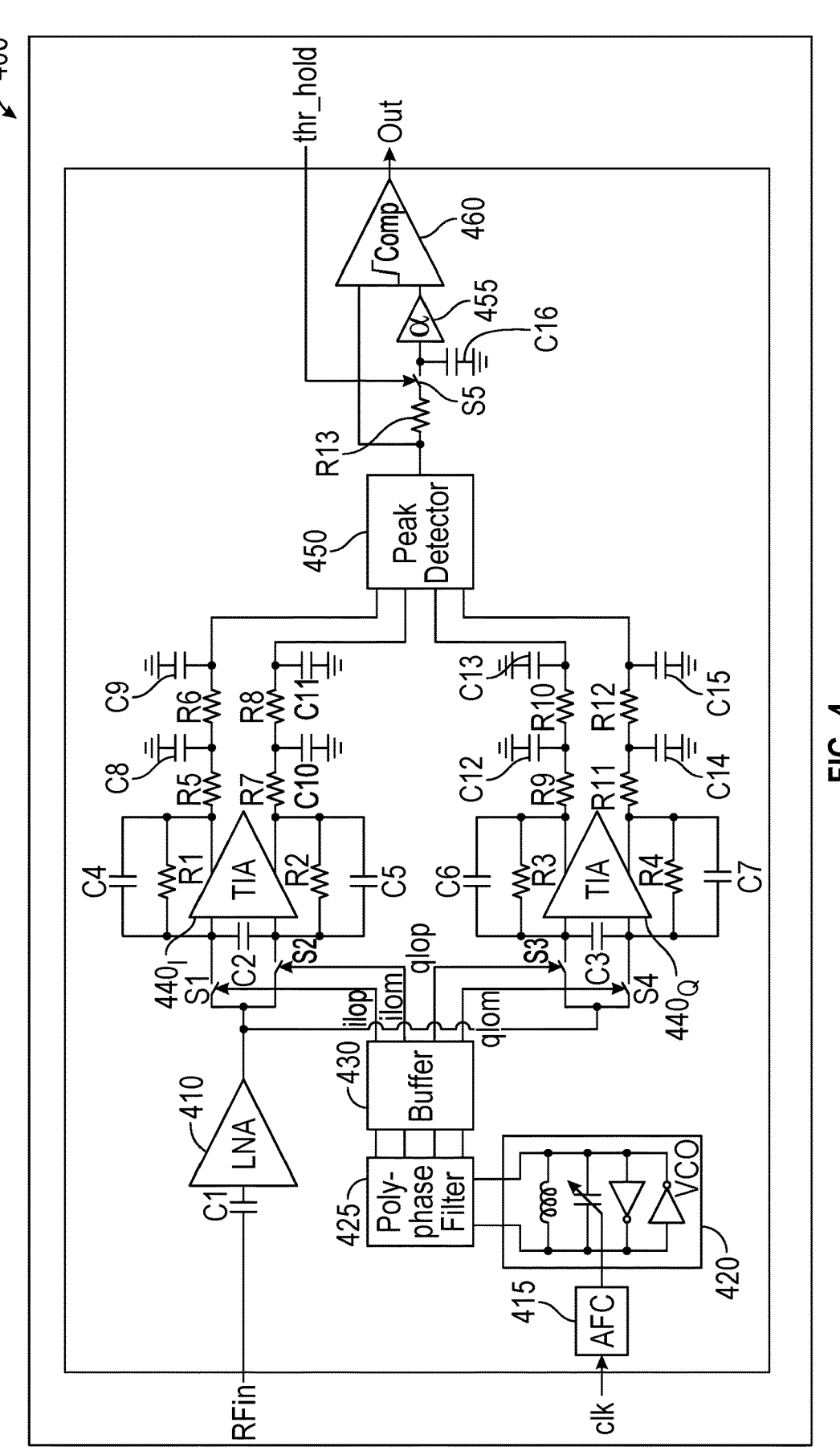
FIG. 4 is a schematic diagram of a portion of a wake-up radio in accordance with an embodiment.

Referring now to FIG. 4, shown is a schematic diagram of a portion of a wake-up radio in accordance with an embodiment. As shown in FIG. 4, wake-up radio 400 includes an RF circuit to receive and process incoming RF signals, and downconvert them to lower frequency signals (e.g., intermediate frequency (IF), low-IF, or zero IF (ZIF) signals). In turn, an IF circuit couples to the RF circuit to receive and process the IF signals to provide an output signal that, when valid, identifies that a detected signal exceeds a threshold (where this detected signal can then be processed to identify a wake-up communication).

As illustrated in FIG. 4, radio 400 receives incoming RF signals (RFin) in a LNA 410 having a coupling capacitor C1 coupled to an input thereof. In an embodiment, LNA 410 is implemented as a low noise transimpedance amplifier, although other amplifiers may be used in other implementations. In the high level shown in FIG. 4, resulting amplified RF signals are downconverted though a passive mixer implemented with a plurality of switches S1-S4, which are controlled by LO signals.

Resulting quadrature IF signals are provided to corresponding TIAs 440$_{I,Q}$ (strictly speaking TIA 440 is constructed with opamps and resistors (e.g., R1, R2 for TIA 440$_I$) for conversion to voltage signals. As shown, RC filters are coupled to TIAs 440 (with respective resistors R1-R4 and capacitors C4-C7). Input capacitors C2, C3 are coupled in parallel to the differential inputs of TIAs 440. The resulting voltage signals output from TIAs 440 pass through additional filters (formed of resistors R5-R12 and capacitors C8-C15), and are provided to a peak detector 450.

Peak detector 450 is configured to identify a maximum of one of the four phase IF signals. As will be described further below, peak detector 450 may be implemented by using a switched-capacitor circuit. The resulting peak signal is provided to a comparator 460, where it is compared to a threshold signal that is self-generated based on a filtering of the peak signal via the schematic representation of RC filter formed of resistor R13 and capacitor C16 (and scaled via a gain factor 455). In one embodiment, the RC filter is implemented with switched-capacitor circuitry. When the peak signal exceeds the threshold, a valid output signal is sent, indicating receipt of a valid Manchester-encoded bit (a valid communication is not realized until the entire packet is examined and a cyclic redundancy checksum (CRC) is valid). Note that the threshold can be locked by control of a switch S5, in response to a threshold hold signal sent from downstream digital circuitry.

As further shown in FIG. 4, quadrature LO signals (ilop, ilom, qlop, qlom) are generated via clock circuitry, which includes a voltage-controlled oscillator (VCO) 420 that in turn is coupled to a polyphase filter 425 and a buffer 430. With this arrangement, use of a phase locked loop (PLL) is avoided, minimizing die area and power consumption.

In embodiments, VCO 420 may be implemented with an open loop high frequency CMOS LC oscillator configuration with periodically activated automatic frequency control (AFC) to reduce power consumption, complexity and die area. While open loop, an AFC circuit 415 is a slowly running control circuit that may be periodically enabled to provide closed loop frequency control to VCO 420, albeit at a very low frequency. For example in an embodiment, AFC loop 415 may operate at a frequency of 32 kilohertz (kHz) while VCO operates at a frequency of 2.4 Gigahertz (GHz). As will be described further herein, LNA 410 and VCO 420 may be implemented in a stacked circuit configuration to enable reuse of current. Similarly, 25% duty-cycled LO generator circuitry and LO buffers also may be implemented in a stacked circuit configuration to enable reuse of current. Although shown at this high level in the embodiment of FIG. 4, many variations and alternatives are possible.

Figure 5:
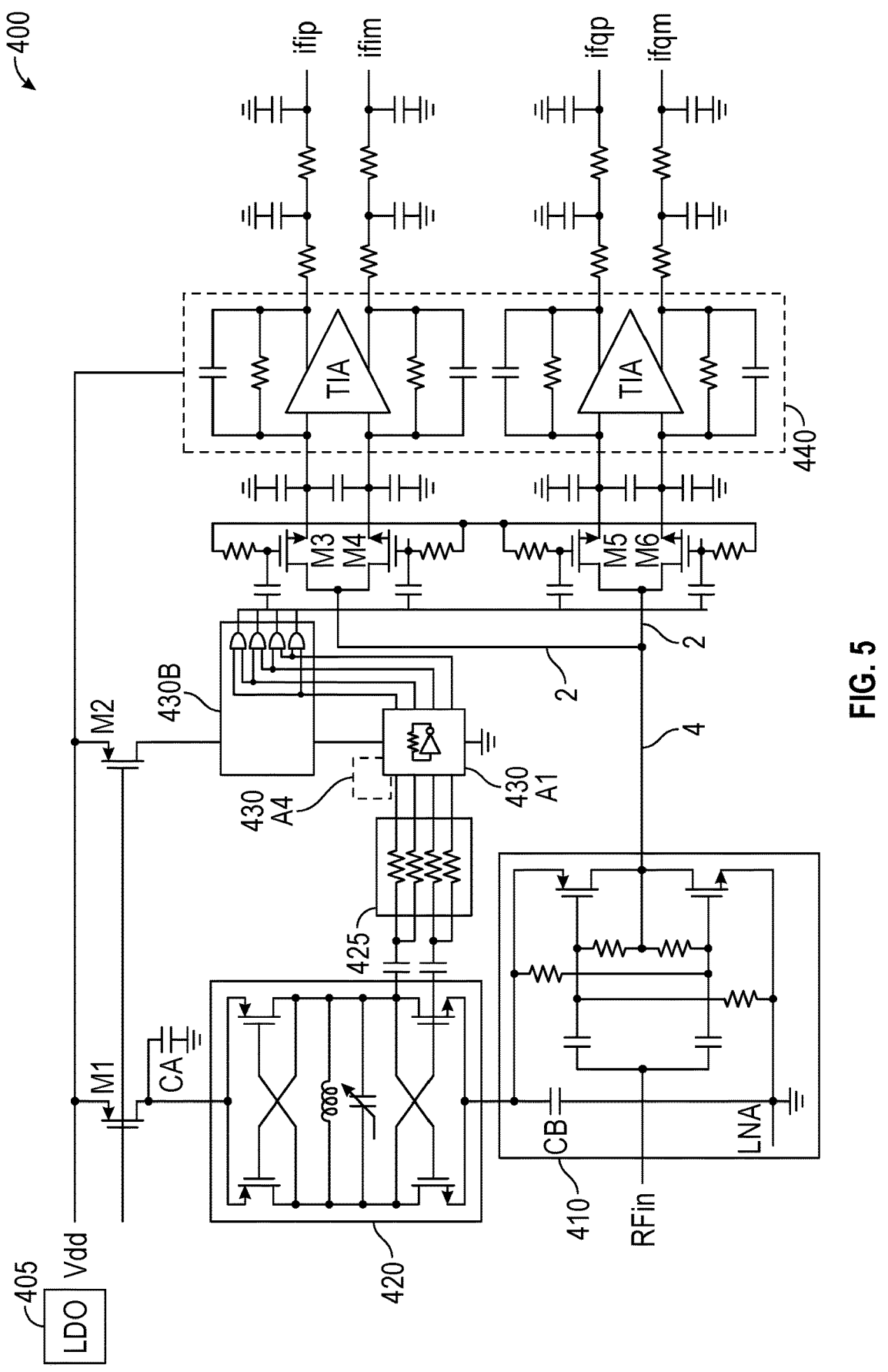
FIG. 5 is a further schematic diagram of a portion of a wake-up radio in accordance with an embodiment.

Referring now to FIG. 5, shown is a further schematic diagram of a portion of a wake-up radio in accordance with an embodiment. In FIG. 5, radio 400 is illustrated in a form that demonstrates the circuit stacking configuration. More specifically, LNA 410 and VCO 420 are coupled in a stacked configuration to reuse a current provided via a regulated voltage (Vdd), generated by a low dropout (LDO) regulator 405. MOSFET M1 provides this current, which in an embodiment, may be approximately 55 microamperes (uA). With embodiments, LNA 410 is not to be saturated when a large blocker, e.g., 40 dB at 2 MHz offset is present. Also with this arrangement, large voltage swings at the LNA output are avoided before the RF signal current is down-converted, by deferring current to voltage conversion to TIA where large currents due to strong blockers are filtered in the IF frequency domain through TIA's frequency response.

Similarly, duty cycled LO generation circuitry 430B and buffers 430$_{A1-A4}$ are coupled in a stacked configuration to reuse a current provided via the regulated voltage. Here MOSFET M2 provides this current which, in an embodiment, may be approximately 22 uA.

Note the presence of capacitors CA, coupled to a drain terminal of MOSFET M1), and CB, coupled between a mid-point of the first stack circuit formed of VCO 420 and LNA 410) and a reference voltage node (e.g., ground). These capacitors reduce supply ripple at the maximum voltage (CA) and at the midrail node (CB), thereby providing stable, low ripple DC voltages for VCO and LNA local supplies. Note that the DC mid-point is controlled without an explicit servo loop because LNA 410 self-biases at a PMOS plus NMOS diode drop, forming a low DC impedance.

As further illustrated, the amplified RF signal output from LNA 410 (shown at circuit node A) couples to the RF port of passive mixers implemented with MOSFETs M3-M6 while the LO signals output from buffer 430B couple to the LO port of the passive mixers. In turn, the resulting IF signals are provided to TIA 440. The resulting quadrature IF (voltage) signals (ifip, ifim, ifqp, ifqm) output from TIA 440 in turn are provided to peak detector circuitry (not shown in FIG. 5) after passing through a passive RC filter.

Figure 6:
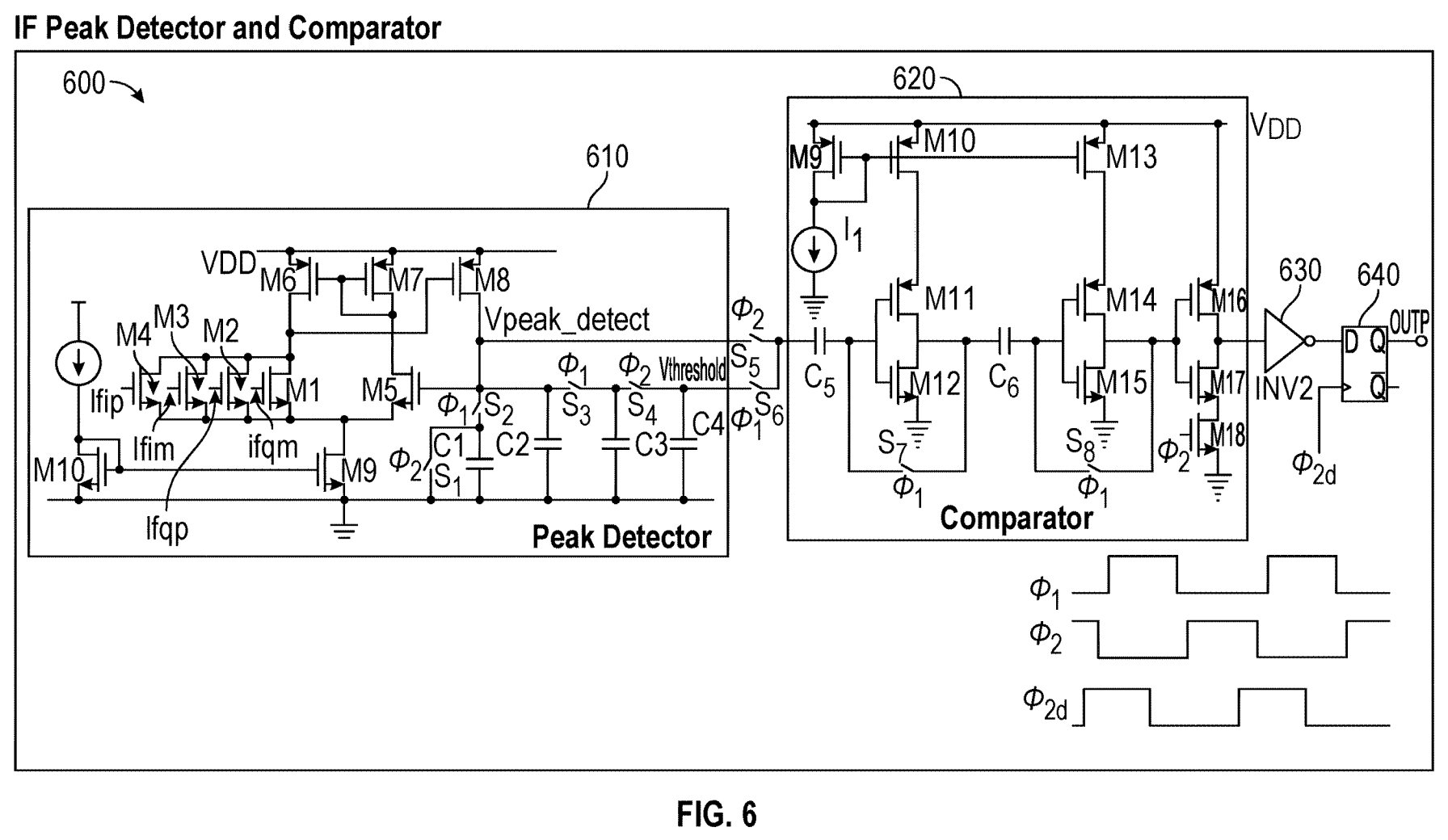
Figure 7:
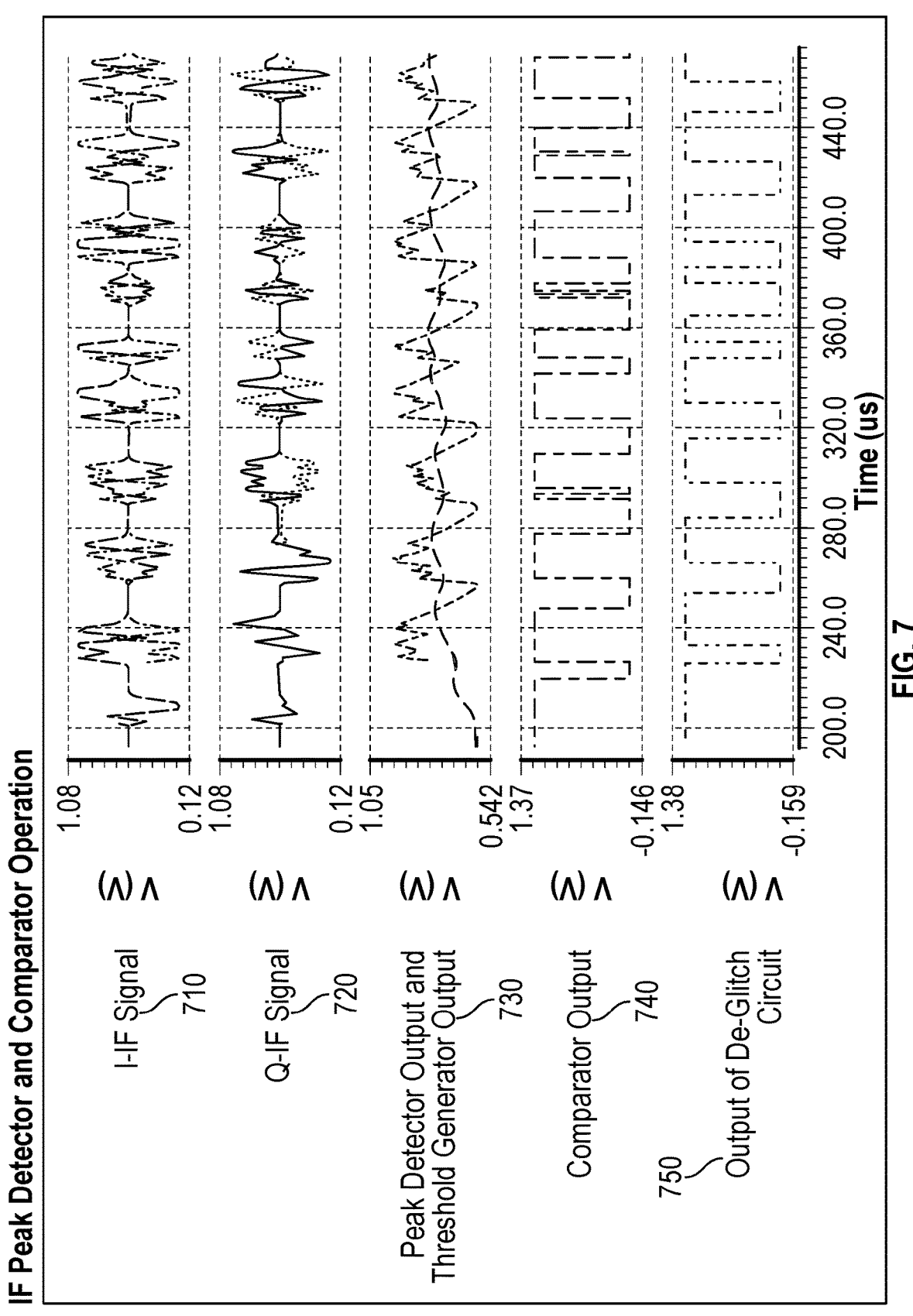
FIG. 7 depicts numerous waveforms associated with IF, peak detector and comparator circuits.

Referring now to FIG. 6, shown is a schematic diagram of a peak detector and comparator in accordance with an embodiment. As shown in FIG. 6, circuit 600, also part of a wake-up radio, includes a peak detector 610 and a comparator 620. First with regard to peak detector 610, incoming IF signals (as output by a TIA, e.g., TIA 440) are received via gate terminals of a plurality of MOSFETs M1-M4, and via a differential NMOS pair arrangement, a maximum signal of these IF signals is detected at the output of a switched-capacitor circuit (as V$_{peak\_detect}$ in FIG. 6). As shown, the switched capacitor circuit includes four capacitors C1-C4 that are switchably controlled via a plurality of switches S1-S4 (in turn controlled by corresponding phase signals θ$_1$, θ$_2$, θ$_{2D}$). An illustration of the control of these switches is shown in FIG. 7 below. In the embodiment of FIG. 6, peak detector 610 thus follows the maximum of the four single-ended IF signals. Switched capacitors C1-C4 implement a hold function (C2), a droop function (C1) and an equivalent RC filter with C3 and C4, and associated switches.

There are two decaying time constants in this implementation: (1) a decaying time constant of the peak detector, which detects the peak value of the IF signals and is formed by capacitors C1-C2; and (2) a decaying time of the filter that self-generates the threshold voltage from the peak detector output and is formed by capacitors C3-C4.

By using switched-capacitor implementations as opposed to RC circuits as shown in FIG. 3A, RC time constant process variations are eliminated, as the decaying time constant here is dependent on capacitor ratios and reference frequency only.

In general, the switched capacitor circuit includes a hold circuit with droop, a low pass filter, and switching circuitry to controllably provide the peak signal and the threshold voltage to comparator 620. In the embodiment of FIG. 6, hold circuit with droop is implemented with capacitors C1, C2, and switches S1 and S2, which form a hold function with droop for peak detector 610. Note that while the droop function is achieved here with switched-capacitors, in other implementations a resistor or small current source can be used. A low pass filter is also provided to achieve the threshold voltage, using capacitors C3, C4, and switches S3, S4 (where capacitor C3 and switches S3,S4 implement the equivalent of a resistor). In other implementations, a low pass filter could be formed of an opamp-based approach with RC's or with switched-capacitors.

Still with reference to FIG. 6, comparator 620 is implemented as an offset-cancelling comparator having three gain stages. Each gain stage is formed with a pair of series-coupled NMOS/PMOS devices, collectively, as inverters M11/M12 and M14/M15 and M16/M17. Switches S7 and S8 are closed during an auto-zero operation of comparator 620. During this auto-zero operation, switches S5, S7 and S8 are closed. Vthreshold and the offset of inverter M11/M12 is held on capacitor C5, and the offset of inverter M14/15 is held on capacitor C6. The resulting comparison signal is output through an inverter 630 and a de-glitch circuit (not shown in FIG. 6), the output of which is sampled via a D-type flip-flop circuit 640, controlled by phase signal θ$_{2D}$.

Comparator 620 may operate with low power consumption. As illustrated, a current mirror configuration is formed of a current source 11, and a plurality of MOSFETs M9, M10, M13. In an embodiment, current source may have a current of approximately 1 uA, and currents of approximately 400 nanoamperes (nA) and 200 nA may be provided via MOSFETs M10, M13, respectively, to the first two gain stages.

Based on the switching control, the detected peak signal passes via switch S5 to comparator 620 during a comparison phase. In turn, the self-generated threshold passes via switch S6 during the auto-zeroing phase. In one or more embodiments, the threshold signal is generated by averaging the peak detector output by a time constant of approximately 30 us.

Referring now to FIG. 7, shown are timing diagrams 710-750 illustrating IF peak detector and comparator operation in accordance with an embodiment. Waveforms 710 and 720, respectively, show the quadrature IF signals output from a TIA in accordance with an embodiment. Waveform 730 shows the peak detector output (namely the curve having larger slope changes), and the threshold generator output, which tracks the peak detector output in a self-generated, filtered manner. Waveform 740 shows the comparator output, which in turn is de-glitched via a de-glitch circuit, resulting in the output waveform 750, which may be provided to additional downstream processing circuitry of a demodulator. Although shown with these respective waveforms and the embodiment of FIG. 7, many variations and alternatives are possible.

Figure 8:
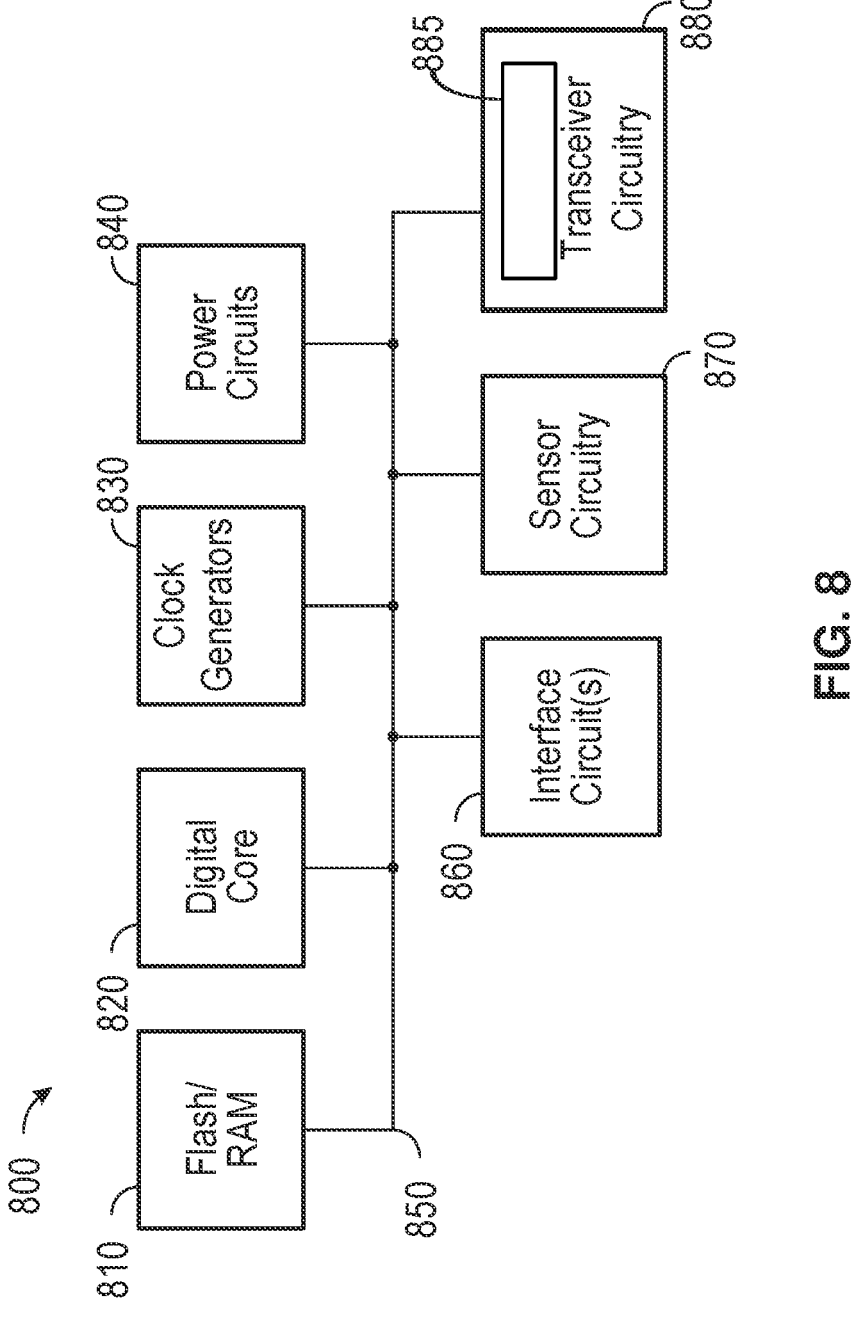
FIG. 8 is a block diagram of a representative integrated circuit that incorporates an embodiment.

Embodiments may be incorporated into many different types of wireless systems. Referring now to FIG. 8, shown is a block diagram of a representative integrated circuit 800 that includes transceiver circuitry having a stacked circuit arrangement to reuse currents as described herein. In the embodiment shown in FIG. 8, integrated circuit 800 may be, e.g., a microcontroller, wireless transceiver that may operate according to one or more wireless protocols (e.g., WLAN-OFDM, WLAN-DSSS, Bluetooth, IEEE 802.15.4, among others), or other device that can be used in a variety of use cases, including sensing, metering, monitoring, embedded applications, communications, applications and so forth, and which may be particularly adapted for use in an IoT device.

In the embodiment shown, integrated circuit 800 includes a memory system 810 which in an embodiment may include a non-volatile memory such as a flash memory and volatile storage, such as RAM. In an embodiment, this non-volatile memory may be implemented as a non-transitory storage medium that can store instructions and data.

Memory system 810 couples via a bus 850 to a digital core 820, which may include one or more cores and/or microcontrollers that act as a main processing unit of the integrated circuit. In turn, digital core 820 may couple to clock generators 830 which may provide one or more phase locked loops or other clock generator circuitry to generate various clocks for use by circuitry of the IC (some of which may be implemented in a stacked arrangement as described herein).

As further illustrated, IC 800 further includes power circuitry 840, which may include one or more voltage regulators or DC-DC converters. Additional circuitry may optionally be present depending on particular implementation to provide various functionality and interaction with external devices. Such circuitry may include interface circuitry 860 which may provide interface with various off-chip devices, sensor circuitry 870 which may include various on-chip sensors including digital and analog sensors to sense desired signals, such as for a metering application or so forth.

In addition as shown in FIG. 8, transceiver circuitry 880 may be provided to enable transmission and receipt of wireless signals according to one or more of a local area or wide area wireless communication scheme. As shown, transceiver circuitry 880 includes stacked circuitry 885 that may reuse currents as described herein. Understand while shown with this high level view, many variations and alternatives are possible.

Note that ICs such as described herein may be implemented in a variety of different devices such as an IoT device. This IoT device may be a smart utility meter for use in a smart utility network, e.g., a network of stars or gateways in which long-range communication is according to an IEEE 802.15.4 specification or other such wireless protocol.

Figure 9:
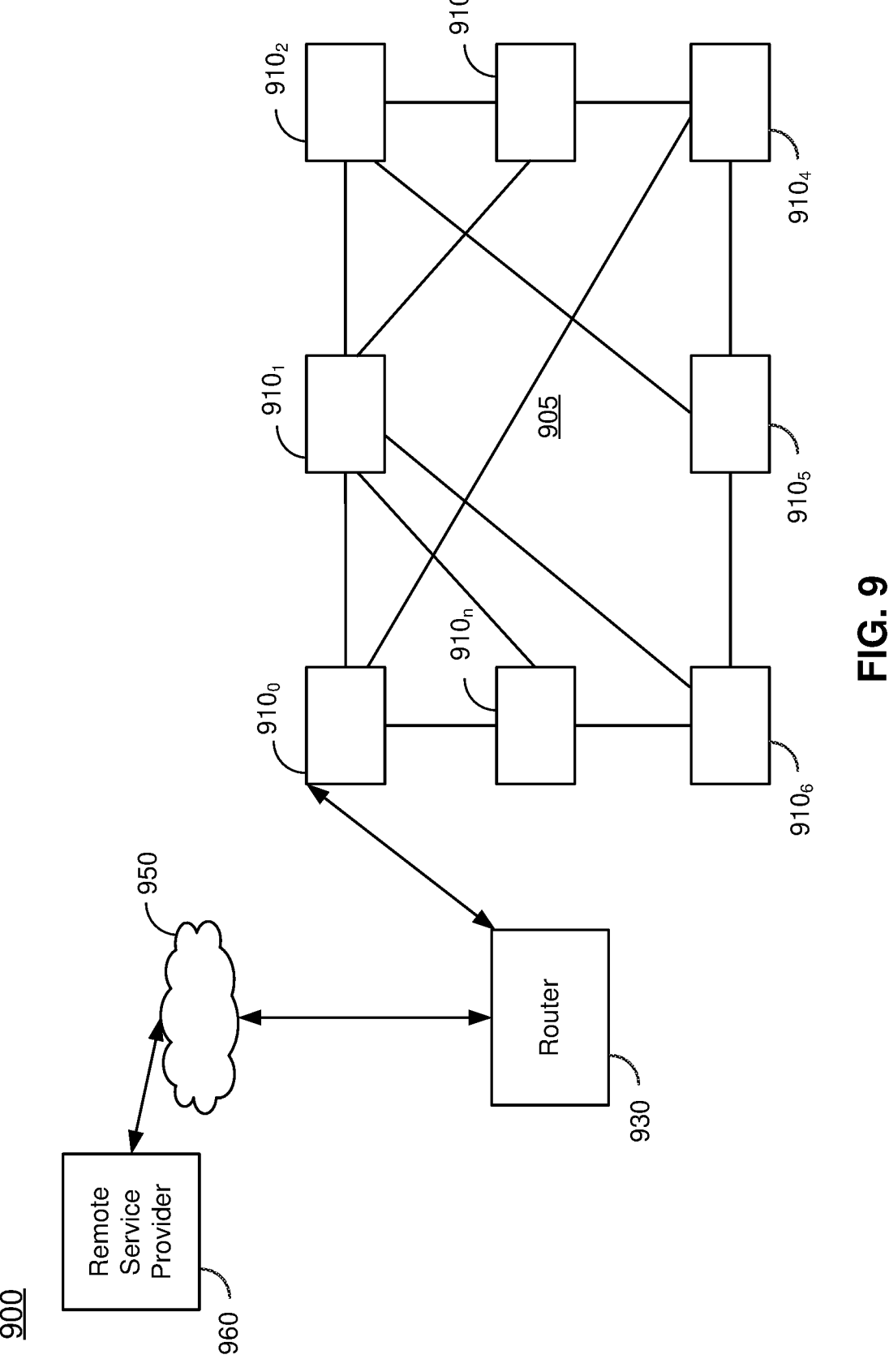
FIG. 9 is a high level diagram of a network in accordance with an embodiment.

Referring now to FIG. 9, shown is a high level diagram of a network in accordance with an embodiment. As shown in FIG. 9, a network 900 includes a variety of devices, including smart devices such as IoT devices, gateways/routers and remote service providers. In the embodiment of FIG. 9, a mesh network or network of stars 905 may be present in a long range environment having multiple IoT devices 910$_{0-n}$. Such IoT devices may receive and process packets (including wake-up packets as described herein). As shown, at least one IoT device 910 couples to one or more gateway(s) 930 that in turn communicates with a remote service provider 960 via a wide area network 950, e.g., the internet. In an embodiment, remote service provider 960 may be a backend server of a utility that handles communication with IoT devices 910. Understand while shown at this high level in the embodiment of FIG. 9, many variations and alternatives are possible.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   a first stack circuit comprising:
      a low noise amplifier (LNA) to receive and amplify a radio frequency (RF) signal; and
      a voltage controlled oscillator (VCO) coupled to the LNA, the VCO to generate at least one clock signal, wherein the VCO is coupled between a supply voltage node and a node of the first stack circuit and the LNA is coupled between the node and a reference voltage node, and wherein the first stack circuit is to reuse a first current for the LNA and the VCO; and
   a second stack circuit coupled to the first stack circuit, the second stack circuit comprising:
      a local oscillator (LO) generation circuit to generate at least one LO clock signal based at least in part on the at least one clock signal; and
      at least one buffer coupled to the LO generation circuit to buffer the at least one LO clock signal and output a differential complex clock signal, wherein the second stack circuit is coupled to the supply voltage node and to reuse a second current for the LO generation circuit and the at least one buffer.

2. The apparatus of claim 1, further comprising a low dropout regulator coupled to the supply voltage node, the low dropout regulator to provide a regulated voltage to the supply voltage node.

3. The apparatus of claim 1, wherein the VCO comprises an open loop VCO.

4. The apparatus of claim 3, further comprising an automatic frequency control (AFC) loop coupled to the VCO, the AFC loop to adjust the VCO at a frequency substantially lower than the at least one clock signal.

5. The apparatus of claim 1, wherein the LNA is coupled to the VCO at the node comprising a midpoint of the first stack circuit.

6. The apparatus of claim 1, further comprising a polyphase filter coupled between the VCO and the LO generation circuit, the polyphase filter to receive the at least one clock signal and output a polyphase clock signal.

7. The apparatus of claim 6, wherein the at least one buffer comprises a first buffer to buffer the differential complex clock signal, and the LO generation circuit comprises a duty cycled pulse generator to provide the at least one LO clock signal for mixing with the amplified RF signal.

8. The apparatus of claim 1, further comprising a transimpedance amplifier (TIA) coupled to the second stack circuit, the TIA to receive and amplify an intermediate frequency (IF) signal, the IF signal based on the RF signal.

9. The apparatus of claim 8, further comprising:
   a peak detector coupled to the TIA, the peak detector to detect a peak signal of the amplified IF signal; and
   a comparator to compare the peak signal to a threshold signal.

10. The apparatus of claim 9, wherein the peak detector is to self-generate the threshold signal based on the peak signal.

11. The apparatus of claim 1, wherein the LNA of the first stack circuit is to provide a low impedance at DC to achieve a stable midpoint voltage for the first stack circuit.

12. An apparatus comprising:
   a peak detector to receive quadrature intermediate frequency (IF) signals and output, at an output node, a maximum signal of the quadrature IF signals, the peak detector comprising a switched capacitor circuit to store the maximum signal and generate a threshold signal; and a comparator coupled to the peak detector, the comparator to compare the maximum signal to the threshold signal.

13. The apparatus of claim 12, wherein the peak detector is to self-generate the threshold signal.

14. The apparatus of claim 12, wherein the switched capacitor circuit comprises:

a hold circuit to hold the maximum signal with droop, the hold circuit comprising at least one first capacitor and at least one first switch, the at least one first switch controlled by a first phase signal.

15. The apparatus of claim 14, wherein the switched capacitor circuit further comprises:

a low pass filter coupled to the hold circuit, wherein the low pass filter is to provide the threshold signal to the comparator.

16. The apparatus of claim 14, further comprising:

a second switch controlled by the first phase signal, the second switch to couple the threshold signal to the comparator circuit; and a third switch controlled by a second phase signal to couple the maximum signal to the comparator.

17. An apparatus comprising:

a wake-up radio to issue a trigger signal in response to detection of a wake-up message in a radio frequency (RF) signal, the wake-up radio comprising:

a low dropout regulator to provide a supply voltage to a supply voltage node;

a first stack circuit coupled to the supply voltage node, the first stack circuit comprising:

an amplifier to receive and amplify the RF signal; and an oscillator coupled to the amplifier, the oscillator to generate at least one clock signal, wherein the first stack circuit is to reuse a first current for the amplifier and the oscillator; and a second stack circuit coupled to the supply voltage node, the second stack circuit comprising:

a clock generation circuit to receive the at least one clock signal and output a polyphase clock signal; and at least one buffer coupled to the clock generation circuit to buffer the polyphase clock signal and output a set of clock signals, wherein the second stack circuit is to reuse a second current for the clock generation circuit and the at least one buffer;

a transimpedance amplifier (TIA) coupled to the supply voltage node, the first stack circuit, and the second stack circuit, the TIA to receive and amplify intermediate frequency (IF) signals, the IF signals based on the RF signal;

a peak detector to receive the IF signals and output a maximum signal of the IF signals, the peak detector comprising a switched capacitor circuit to store the maximum signal and a threshold signal; and a comparator coupled to the peak detector, the comparator to compare the maximum signal to the threshold signal and output a trigger signal when the maximum signal exceeds the threshold signal; and a second radio coupled to the wake-up radio, the second radio to wake up in response to receipt of the trigger signal.

18. The apparatus of claim 17, wherein the amplifier comprises:

a plurality of gain slices; and a plurality of dummy load circuits coupled to the plurality of gain slices.

19. The apparatus of claim 18, further comprising a controller to:

control a number of the plurality of slices to be enabled based at least in part on a gain control signal; and cause at least one of the plurality of dummy loads to be coupled to a midpoint of the first stack circuit when a corresponding slice of the plurality of slices is disabled.

20. The apparatus of claim 17, wherein the wake-up radio is coupled to the second radio without substantial loading.

* * * * *